United States Patent [19]

Rupp, Jr. et al.

[11] 4,048,555
[45] Sept. 13, 1977

[54] SPIN RESONANCE SPECTROMETER AND MAGNET STRUCTURE

[75] Inventors: Louis William Rupp, Jr., Kintnersville, Pa.; Walter Michael Walsh, Jr., Berkeley Heights, N.J.

[73] Assignee: Bell Telephone Laboratories, Incorporated, Murray Hill, N.J.

[21] Appl. No.: 696,471

[22] Filed: June 15, 1976

[51] Int. Cl.$^2$ ............................................. G01R 33/08
[52] U.S. Cl. .............................. 324/.5 MA; 324/34 S; 335/209; 335/306
[58] Field of Search ......... 324/.5 AC, .5 AH, .5 MA, 324/150, 34 S; 335/209, 306

[56] References Cited

U.S. PATENT DOCUMENTS

| | | | |
|---|---|---|---|
| 1,932,911 | 10/1933 | Rolfe | 324/150 |
| 2,719,924 | 10/1955 | Oppenheimer | 324/.5 MA |
| 3,931,569 | 1/1976 | Hyde | 324/.5 AH |

*Primary Examiner*—M. Tokar
*Attorney, Agent, or Firm*—Allen N. Friedman

[57] ABSTRACT

A permanent magnet structure provides high fields (e.g., ~ 4500 Gauss) with excellent uniformity (e.g., ± 3 Gauss) over a moderately large volume of the gap (e.g., approximately 20 percent of the gap diameter and gap width). This is accomplished by grinding away a portion of the permanent magnet material at the center of each face of the gap to form a depression, deepest at the center of the face. The magnet may include means for varying the gap width and a modulating coil for low frequency minor variation of the magnetic field. The magnet structure is used in conjunction with a 12 GHz self-excited spin resonance cavity to form a compact, portable electron spin resonance spectrometer.

7 Claims, 3 Drawing Figures ically adapted for use in a microwave spin resonance spectrometer. A compact spin resonance spectrometer is also claimed.

SPIN RESONANCE SPECTROMETER AND MAGNET STRUCTURE

Background of the Invention

1. Field of the Invention

The invention is in the field of permanent magnet structures with enhanced field uniformity, particularly adapted for use in a microwave spin resonance spectrometer. A compact spin resonance spectrometer is also claimed.

2. Brief Description of the Prior Art

A microwave spin resonance spectrometer is, typically, a large piece of apparatus including a microwave generator, a waveguide cavity and a large electromagnet with attendant power supply. A compact self-excited spin resonance spectrometer cavity has been developed and is disclosed in U.S. Pat. No. 3,691,453 issued Sept. 12, 1972. However, as disclosed, this spectrometer cavity still required the use of a large electromagnet to produce the approximately 4,500 Gauss magnetic field with the required field uniformity within several Gauss over the sample space.

The prior art also includes moderately high field permanent magnet systems including efforts to improve field uniformity. The magnet system disclosed in U.S. Pat. No. 2,786,971 issued Mar. 26, 1957 includes the use of pole pieces of soft magnetic material which are hollowed in order to increase field uniformity. However, when this technique was tried in the spin resonance spectrometer context, where the gap is relatively wide (e.g., more than 30 percent of the pole diameter) it was found that a significant amount of flux was short circuited through the edges of the soft magnetic pole pieces and around each magnetic pole without passing through the gap. This resulted, in an exemplary construction, in a loss of approximately half of the expected magnetic field.

SUMMARY OF THE INVENTION

It has been found that the uniformity of the magnetic field of a permanent magnet can be greatly improved if the permanent magnet material itself is used to form the pole pieces and the permanent magnetic material is shaped at the gap faces to form axial depressions, deepest in the center of the face. Using this technique a permanent magnet system was constructed for incorporation in a compact, intrinsically portable electron spin resonance spectrometer. The magnet system incorporates two cylinders of axially magnetized $Co_5Sm$, one inch in diameter and three-quarters of an inch high. The magnet produced a 4,500 Gauss field in the center of a 0.45 inch gap. Suitable holowing of the permanent magnet material of the pole piece faces produced field uniformity within ± 3 Gauss over a sample space volume two-tenths of an inch in diameter and two-tenths of an inch high at the center of the gap. The magnet incorporated a micrometer head for gap width adjustment and modulating coils required for the spectrometer application. It was successfully used together with a self-excited spectrometer cavity, of the type mentioned above, to observe electron spin resonance in the 12 GHz frequency range.

DETAILED DESCRIPTION OF THE INVENTION

Figure 1:
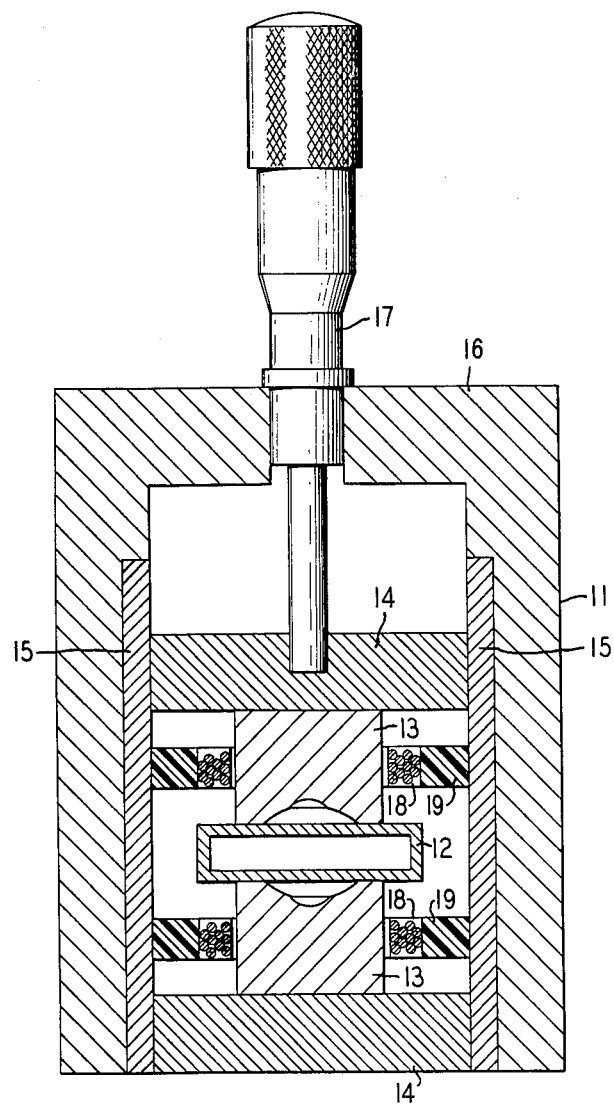
FIG. 1 is an elevational view in section of an exemplary spin wave resonance spectrometer.
Figure 2:
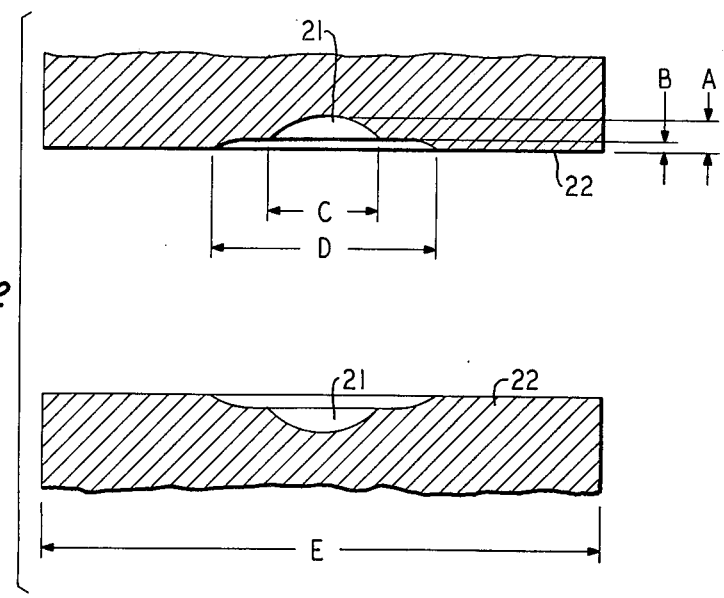
FIG. 2 is an elevational view in section showing, in detail, the pole piece shaping used.

A compact microwave spin resonance spectrometer is shown in FIG. 1. This figure shows a permanent magnet structure 11 and the spectrometer cavity 12. The cavity 12 is constructed and powered substantially as is disclosed in U.S. Pat. No. 3,691,453, mentioned above. In the construction of the cavity, care is taken to exclude any domain magnetic material which would adversely affect field uniformity. The gap within which the cavity 12 is situated is formed by two cylinders of permanent magnet material 13. The return flux path is provided by a housing including horizontal pieces 14 and vertical pieces 15 of soft magnetic material. It also includes a frame 16 and a micrometer head 17 which hold the permanent magnetic material 13 in a spaced relationship, which may be varied by operation of the micrometer head 17. The cylinders of magnetic material 13 are axially magnetized with poles of opposite polarity facing one another. On both sides of the gap the faces of the cylinders 13 are contoured to improve field uniformity. The depressions are axially symmetric and are shaped to be monotonically deeper toward the axis. The field modulation coils 18, required for synchronous detection or oscilloscope triggering are firmly mounted to the vertical pieces of soft magnetic material 15 by means of rings 19 of stiff insulating material.

A magnet structure for use in a spin resonance spectrometer was made using $Co_5Sm$ as the permanent magnet material. This material is particularly advantageous because of its high magnetic field and its extremely high coercive force. The three-quarter inch high cylinder on each side of the gap was composed to two three-eights of an inch thick disks which were commerically available. The disks were 1 inch in diameter (dimension E) the depressions 21 at the center of each faces 22 consists of two concentric portions, the diameter of the outer portion (D) was four tenths of the pole diameter and the depth of that portion (B) was 0.015 of the pole diameter. The diameter of the cetral portion (C) was two-tenths of the pole diameter and the maximum depth (A) of the depression 21 was one-twentieth of the pole diameter.

Figure 3:
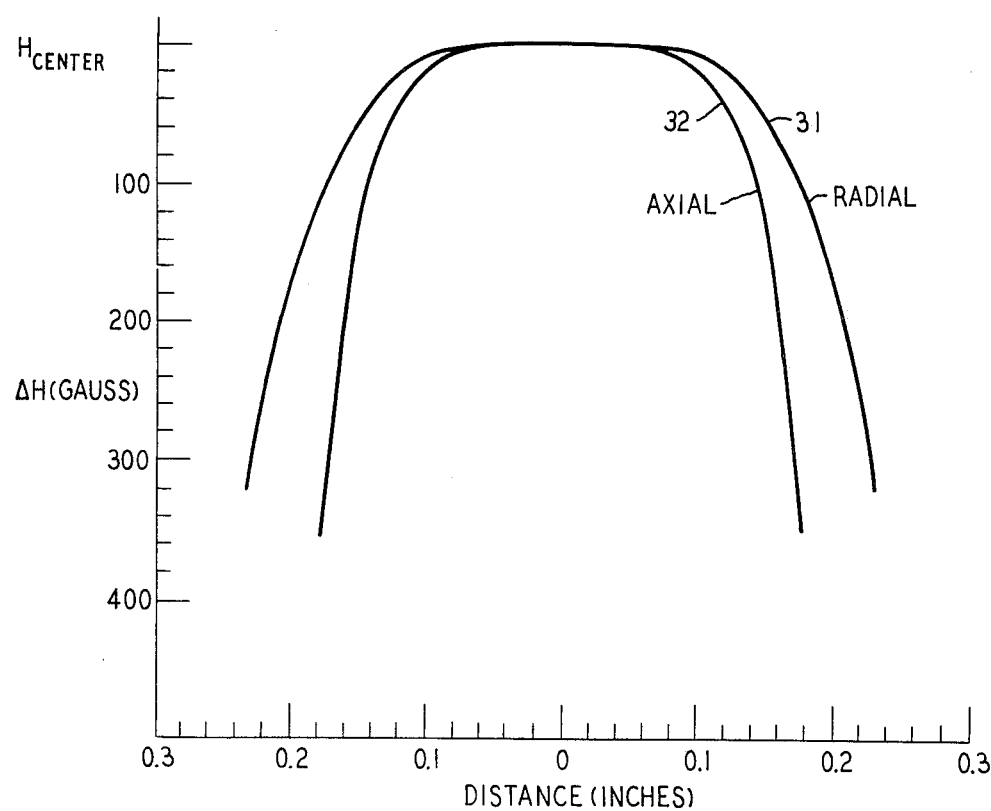
FIG. 3 is a plot of the magnetic field in the gap, showng the magnetic field variation as one moves axially from the center of the gap and radially from the center of the gap.

FIG. 3 shows the variation of the magnetic field as one moves radially 31 and axially 32 from the center of a 0.45 inch gap. The magnetic field strength at the center was approximately 4,500 Gauss. These curves show that there is a cylindrical volume in the center of the gap within which the magnetic field varies by less than ± 3 Gauss over a volume with is 0.2 inches in diameter and 0.2 inches in height.

The range of applicability of the above disclosed magnets with shaped pole faces depends upon several considerations. When the gap is less than approximately one-fifth of the pole diameter, little if any correction is needed to produce fields of the desired uniformity (~ 0.1 percent) over a moderate volume at the center of the gap. When the gap is greater than one-half the pole diameter, the desired uniformity is difficult to achieve at all. The pole faces should remain planar over at least the outer half of the pole radius. The depth of the depression at the center should be no more than one-tenth of the pole diameter, with deeper depressions being required at the wider gap widths.

Two modulation coils 18 were wound of #30 enamelled copper wire (1.60 inches O.D., 1.02 inches I.D., 0.25 inches thick). The coils were driven by 12 volts at 60Hz to produce a 200 Gauss peak to peak modulation at the gap center. Using the above described apparatus the hyperfine structure of the electron spin resonance of doubly ionized manganese impurity in a magnesium oxide single crystal was observed.

What is claimed is:

1. A magnet structure comprising:
   a. a pair of coaxial permanent magnets, each of which is circularly symmetric about the common axis, and each of which possesses a first face and a a second face, the first faces of which are spaced from one another to form a gap free from domain magnetic material, the magnets being axially magnetized with poles of opposite polarity facing one another; and
   b. a housing including soft magnetic material in contact with the permanent magnets at the second face of each magnet, the housing holding the magnets in spaced relationship and providing a return path for magnetic flux around the gap characterized in that the first face of each permanent magnet forms an axial depression so shaped as to be monotonically deeper toward the axis, whereby the radial and axial uniformity of the magnetic field at the center of the gap is improved.

2. A magnet structure of claim 1 in which the first faces are principally planar, with the depressions extending laterally to no more than one-half of the radius of the faces.

3. A magnet structure of claim 2 in which the depth of the depression is approximately one-twentieth of the diameter of the first faces.

4. A magnet structure of claim 1 in which the housing includes means for varying the width of the gap.

5. A magnet structure of claim 4 in which the housing includes a pair of coaxial modulation coils, one coil surrounding each of the permanent magnets.

6. A microwave spin resonance spectrometer comprising a magnet structure of claim 5 and a microwave spin resonance cavity structure so fixed in the gap that the sample space of the cavity is axially situated at the center of the gap.

7. A magnet structure of claim 1 in which the permanent magnets consist of $Co_5Sm$.

* * * * *